(12) United States Patent
Kamono

(10) Patent No.: US 6,803,996 B2
(45) Date of Patent: Oct. 12, 2004

(54) DEVICE MANUFACTURING-RELATED APPARATUS, GAS PURGE METHOD, AND DEVICE MANUFACTURING METHOD

(75) Inventor: Takashi Kamono, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/307,992

(22) Filed: Dec. 3, 2002

(65) Prior Publication Data

US 2003/0117609 A1 Jun. 26, 2003

(30) Foreign Application Priority Data

Dec. 4, 2001 (JP) .................................. 2001-370352

(51) Int. Cl.⁷ .................. G03B 27/52; G03B 27/62; G03B 27/72; G03F 9/00
(52) U.S. Cl. ...................... 355/75; 355/30; 355/71; 430/5
(58) Field of Search .................... 355/30, 71, 75; 430/5

(56) References Cited

U.S. PATENT DOCUMENTS

| | | | | |
|---|---|---|---|---|
| 4,737,387 A | * | 4/1988 | Yen ........................ | 428/14 |
| 4,833,051 A | * | 5/1989 | Imamura .................. | 430/5 |
| 5,814,381 A | * | 9/1998 | Kuo ........................ | 428/14 |
| 6,436,586 B1 | * | 8/2002 | Matsuoka et al. ........ | 430/5 |
| 6,507,390 B1 | * | 1/2003 | Ivaldi ..................... | 355/75 |
| 6,593,034 B1 | * | 7/2003 | Shirasaki ................. | 430/5 |
| 2002/0112824 A1 | * | 8/2002 | Imamura .................. | 430/5 |
| 2002/0154285 A1 | * | 10/2002 | Ramamoorthy et al. .... | 355/72 |
| 2002/0155359 A1 | * | 10/2002 | Muzio et al. ............. | 430/5 |

FOREIGN PATENT DOCUMENTS

| | | |
|---|---|---|
| JP | 6-27643 | 2/1994 |
| JP | 9-73167 | 3/1997 |
| JP | 9-197652 | 7/1997 |

OTHER PUBLICATIONS

H. Okabe, "Photochemistry Of Small Molecules," Wiley–Interscience Publication, 1978, pp. 176–183.

* cited by examiner

*Primary Examiner*—Rodney Fuller
(74) *Attorney, Agent, or Firm*—Fitzpatrick, Cella, Harper & Scinto

(57) ABSTRACT

A reticle (23) with a pellicle is movably set on a reticle support table (28). An inert gas supply portion (29) and inert gas exhaust portion (37) are so driven as to sandwich a pellicle frame (25), and align the pellicle frame (25). The inert gas supply portion (29) and inert gas exhaust portion (37) are brought into tight contact with the pellicle frame (25). In this state, inert gas is supplied from the inert gas supply portion (29) into the pellicle space via a vent hole (27) of the pellicle frame (25). Inert gas is exhausted to the inert gas exhaust portion (37) via a vent hole (27) formed on the opposite side.

26 Claims, 15 Drawing Sheets

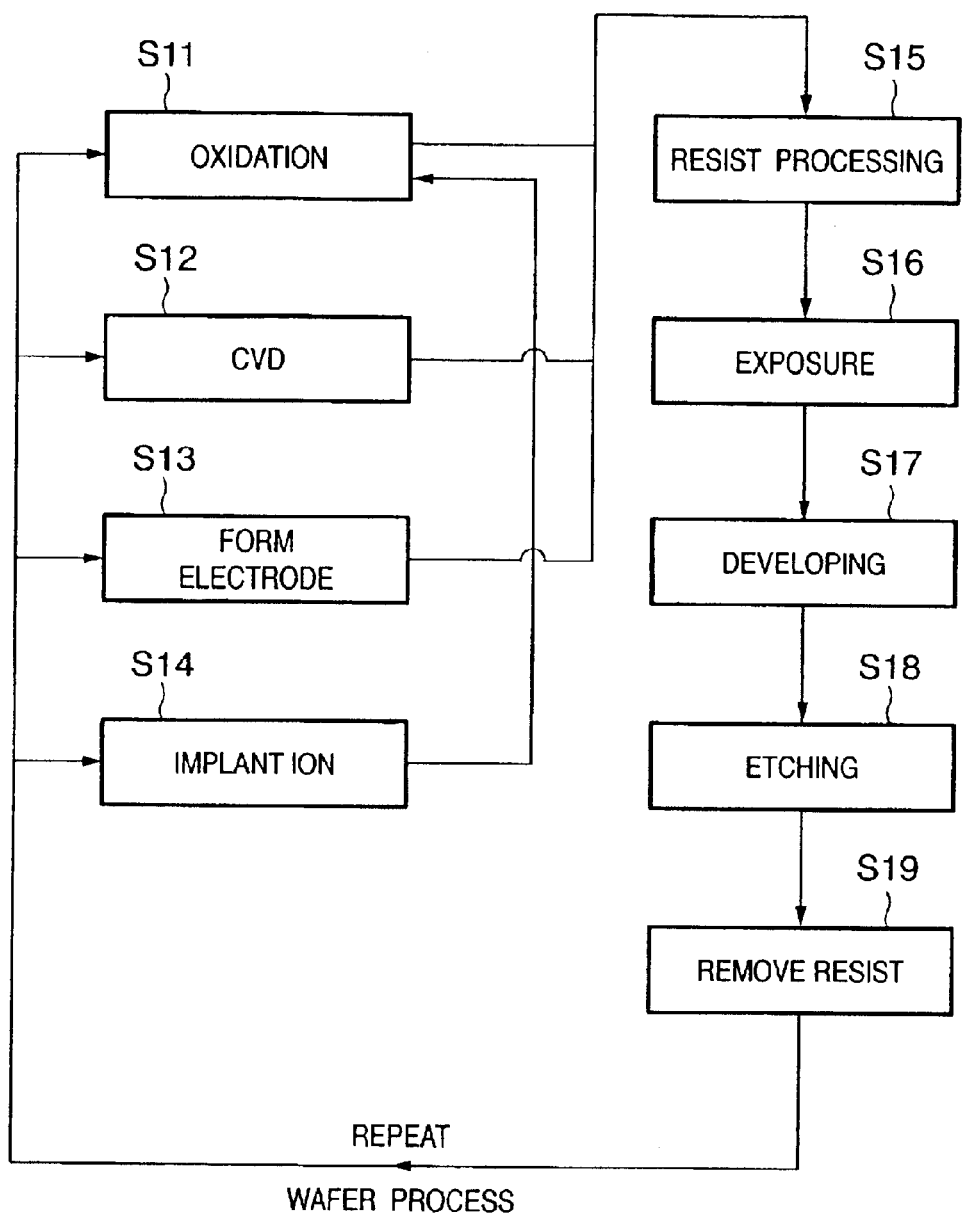

DEVICE MANUFACTURING-RELATED APPARATUS, GAS PURGE METHOD, AND DEVICE MANUFACTURING METHOD

FIELD OF THE INVENTION

The present invention relates to a device manufacturing-related apparatus, gas purge method, and device manufacturing method and, more particularly, to a device manufacturing-related apparatus (e.g., an exposure apparatus, gas purge apparatus, reticle inspection apparatus, or reticle transfer box) having a space for storing a reticle with a pellicle whose pellicle film is supported by a pellicle frame, a gas purge method of purging the pellicle space within the pellicle frame with inert gas, and a device manufacturing method.

BACKGROUND OF THE INVENTION

A manufacturing process for a semiconductor element such as an LSI or VLSI formed from a micropattern uses a reduction type projection exposure apparatus for printing and forming by reduction projection a circuit pattern drawn on a mask onto a substrate coated with a photosensitive agent. With an increase in the packaging density of semiconductor elements, demands have arisen for further micropatterning. Exposure apparatuses are coping with micropatterning along with the development of a resist process.

Methods of increasing the resolving power of the exposure apparatus include a method of changing the exposure wavelength to a shorter one, and a method of increasing the numerical aperture (NA) of the projection optical system.

As for the exposure wavelength, a KrF excimer laser with an oscillation wavelength of 365-nm i-line to recently 248 nm, and an ArF excimer laser with an oscillation wavelength around 193 nm have been developed. A fluorine ($F_2$) excimer laser with an oscillation wavelength around 157 nm is also under development.

An ArF excimer laser with an oscillation wavelength around ultraviolet rays, particularly, 193 nm, and a fluorine ($F_2$) excimer laser with an oscillation wavelength around 157 nm are known to have an oxygen ($O_2$) absorption band around their wavelength band.

For example, a fluorine excimer laser has been applied to an exposure apparatus because of a short oscillation wavelength of 157 nm. The 157-nm wavelength falls within a wavelength region called a vacuum ultraviolet region. In this wavelength region, light is greatly absorbed by oxygen molecules, and hardly passes through the air. The fluorine excimer laser can only be applied in an environment in which the pressure is decreased to almost vacuum and the oxygen concentration is fully decreased. According to reference "Photochemistry of Small Molecules" (Hideo Okabe, A Wiley-Interscience Publication, 1978, p. 178), the absorption coefficient of oxygen to 157-nm light is about 190 $atm^{-1}cm^{-1}$. This means when 157-nm light passes through gas at an oxygen concentration of 1% at one atmospheric pressure, the transmittance per cm is only $$T=\exp(-190\times 1\ cm\times 0.01\ atm)=0.150$$

Oxygen absorbs light to generate ozone ($O_3$), and ozone promotes absorption of light, greatly decreasing the transmittance. In addition, various products generated by ozone are deposited on the surface of an optical element, decreasing the efficiency of the optical system.

To prevent this, the oxygen concentration in the optical path is suppressed to low level of several ppm order or less by a purge means using inert gas such as nitrogen in the optical path of the exposure optical system of a projection exposure apparatus using a far ultraviolet laser such as an ArF excimer laser or fluorine ($F_2$) excimer laser as a light source.

In such an exposure apparatus using an ArF excimer laser with a wavelength around ultraviolet rays, particularly, 193 nm, or a fluorine ($F_2$) excimer laser with a wavelength around 157 nm, an ArF excimer laser beam or fluorine ($F_2$) excimer laser beam is readily absorbed by a substance. The optical path must be purged to several ppm order or less. This also applies to moisture, which must be removed to ppm order or less.

For this reason, the interior of the exposure apparatus, particularly, the optical path of ultraviolet rays is purged with inert gas. A load-lock mechanism is arranged at a coupling portion between the inside and outside of the exposure apparatus. When a reticle or wafer is to be externally loaded, the interior of the exposure apparatus is temporarily shielded from outside air. After the load-lock mechanism is purged of oxygen or water with inert gas, the reticle or wafer is loaded into the exposure apparatus.

FIG. 1 is a sectional view schematically showing an example of a semiconductor exposure apparatus having a fluorine ($F_2$) excimer laser as a light source and a load-lock mechanism.

In FIG. 1, reference numeral 1 denotes a reticle stage for setting a reticle bearing a pattern; 2, a projection optical system for projecting the pattern on the reticle onto a wafer; 3, a wafer stage which supports the wafer and is driven in the X, Y, Z, θ, and tilt directions; 4, an illumination optical system for illuminating the reticle with illumination light; 5, a guide optical system for guiding light from the light source to the illumination optical system 4; 6, a fluorine ($F_2$) laser serving as a light source; 7, a masking blade for shielding exposure light so as not to illuminate the reticle except the pattern region; 8 and 9, housings which cover the exposure optical path around the reticle stage 1 and wafer stage 3, respectively; 10, an He air-conditioner for adjusting the interiors of the projection optical system 2 and illumination optical system 4 to a predetermined He atmosphere; 11 and 12, $N_2$ air-conditioners for adjusting the interiors of the housings 8 and 9 to a predetermined $N_2$ atmosphere; 13 and 14, reticle load-lock chambers and wafer load-lock chambers used to load a reticle and wafer into the housings 8 and 9, respectively; 15 and 16, a reticle hand and wafer hand for transferring the reticle and wafer, respectively; 17, a reticle alignment portion used to adjust the reticle position; 18, a reticle stocker for stocking a plurality of reticles in the housing 8; and 19, a pre-alignment unit for pre-aligning the wafer.

If necessary, the overall apparatus is stored in an environment chamber (not shown). Air controlled to a predetermined temperature is circulated within the environment chamber to keep the internal temperature of the chamber constant.

FIG. 2 is a schematic sectional view showing another example of the semiconductor exposure apparatus having a fluorine ($F_2$) excimer laser as a light source and a load-lock mechanism.

The whole exposure apparatus shown in FIG. 2 is covered with a housing 20, and the interior of the housing 20 is purged of $O_2$ and $H_2O$ with $N_2$ gas. Reference numeral 21 denotes an air-conditioner for setting the entire housing 20 in an $N_2$ atmosphere. In this exposure apparatus, the internal spaces of a lens barrel 2 and illumination optical system 4 are partitioned from the internal space (driving system space) of the housing 20, and independently adjusted to an He atmosphere. Reference numerals 13 and 14 denote a reticle load-lock chamber and wafer load-lock chamber used to load a reticle and wafer into the housing 20, respectively.

In general, a reticle is equipped with a pattern protection device called a pellicle. The pellicle prevents deposition of a foreign matter onto a reticle pattern surface, and suppresses the occurrence of defects caused by transfer of a foreign matter onto a wafer.

FIG. 3 is a schematic view showing the structure of a reticle with a pellicle. A pellicle 24 is adhered to the pattern surface of a reticle 23 with an adhesive agent or the like. The pellicle 24 is made up of a pellicle support frame (pellicle frame) 25 large enough to surround the reticle pattern, and a pellicle film 26 which is adhered to one end face of the pellicle support frame 25 and transmits exposure light. If a space (to be referred to as a pellicle space hereinafter) defined by the pellicle 24 and reticle 23 is completely closed, the pellicle film 26 may expand or contract due to the difference in atmospheric pressure between the inside and outside of the pellicle space or the difference in oxygen concentration. To prevent this, a vent hole 27 is formed in the support frame 25 so as to allow gas to flow between the inside and outside of the pellicle space. An auto-screen filter (not shown) is attached to the ventilation path in order to prevent an external foreign matter from entering the pellicle space via the vent hole 27.

FIG. 4 is a schematic view showing an example of a reticle transfer path in the exposure apparatus shown in FIGS. 1 and 2. In FIG. 4, reference numeral 22 denotes a foreign matter inspection device which measures the size and number of foreign matters such as dust deposited on a reticle surface or pellicle film surface. The reticle 23 is loaded manually or by a transfer device (not shown) into the reticle load-lock chamber 13 serving as the entrance of the exposure apparatus. Since the reticle and pellicle are generally adhered outside the exposure apparatus, the pellicle 24 has already been adhered to the loaded reticle 23. The interior of the reticle load-lock chamber 13 is purged with inert gas until the interior reaches an inert gas atmosphere similarly to the housing 8. After that, the reticle 23 is transferred by the reticle hand 15 to any one of the reticle stage 1, reticle stocker 18, and foreign matter inspection device 22.

As described above, an exposure apparatus using ultraviolet rays, particularly, an ArF excimer laser beam or fluorine ($F_2$) excimer laser beam suffers large absorption of the ArF excimer laser beam or fluorine ($F_2$) excimer laser of its wavelength by oxygen and moisture. To obtain a sufficient transmittance and stability of ultraviolet rays, the oxygen and moisture concentrations must be reduced and controlled strictly. For this purpose, a load-lock mechanism is arranged at a coupling portion between the inside and outside of the exposure apparatus. When a reticle or wafer is to be externally loaded into the exposure apparatus, the reticle or wafer is temporarily shielded from outside air. After the interior of the load-lock mechanism is purged of gas such as oxygen with inert gas, the reticle or wafer is loaded into the exposure apparatus.

A reticle loaded into the load-lock chamber bears a pellicle, and the pellicle space can communicate with outside air only through a relatively small vent hole. This structure prolongs a time required to complete purge in the pellicle space even after the interior of the reticle load-lock chamber reaches a predetermined inert gas concentration, degrading the productivity.

As for the vent hole of the pellicle frame, Japanese Patent Laid-Open Nos. 6-27643 and 9-197652 disclose inventions of forming intake and exhaust holes in a pellicle frame. Even if the number of holes or the hole area is increased, the diffusion phenomenon caused by the difference in inert gas concentration between the inside and outside of the pellicle space merely contributes to the purge mechanism as long as the pellicle is set in an inert gas atmosphere. The pellicle space requires a longer purge time, compared to the load-lock chamber which is forcibly purged. When a valve or auto-screen filter is arranged in the hole path, the purge time is further prolonged.

Japanese Patent Laid-Open No. 9-73167 discloses an invention of adhering a reticle and pellicle in advance in an inert gas atmosphere and filling the pellicle space with inert gas at an oxygen concentration of 1% or less. However, the transmittance of 157-nm light is merely 15% per cm in atmospheric-pressure gas at an oxygen concentration of 1%. At present, the gap between the reticle and the pellicle is about 6 mm. Even if this gap is filled with gas at an oxygen concentration of 0.1%, the transmittance of 157-nm light at the gap is merely 89.2%. The total space distance of an optical path from the light source of the exposure apparatus to a wafer exceeds at least 1 m. To ensure a transmittance of 80% or more in the 1-m space, the oxygen concentration must be suppressed to 10 ppmv/v or less, and ideally 1 ppm or less. In the pellicle space, the oxygen concentration must be 1 to 100 ppm or less in terms of the balance with another space and maintenance of the transmittance in the total space distance. This also applies to the moisture and carbon dioxide gas concentrations.

The pellicle space may be temporarily filled with inert gas at these ppm-order oxygen concentrations. If, however, the oxygen concentration of a space where the reticle and pellicle are set is higher than the internal oxygen concentration, oxygen enters the pellicle space via a small gap because the adhering surface between the pellicle frame and the reticle is not a completely airtight structure. The oxygen concentration can be maintained in % order, but it is very difficult to maintain the oxygen concentration in ppm order. A pellicle film made of a fluorine-based resin has oxygen permeability, and it is more difficult to maintain the oxygen concentration in ppm order. A reticle may be set on the reticle stage and exposed at an unsatisfactory inert gas concentration in the pellicle space. Since the inert gas concentration in the pellicle space gradually comes close to an ambient inert gas concentration on the reticle stage, the transmittance of exposure light in the pellicle space changes. As a result, a predetermined exposure amount cannot be stably obtained on a wafer, and an error such as a change in transfer pattern size may occur.

A reticle with a pellicle that is stocked in air outside the exposure apparatus often bears many water molecules deposited on the surface including the pellicle film and pellicle frame. Also when the reticle is stocked in an inert gas atmosphere, the reticle may be exposed to the outside air during loading into the exposure apparatus, and the same problem may occur.

The amount of water molecules deposited on the surface of the pellicle film or the like greatly depends on the microscopic roughness of the surface, the surface shape, and particularly whether the surface is hydrophilic or hydrophobic. For a resin material, the resin may slightly absorb water. It is not rare to use a fluorine-based resin material for the pellicle film or auto-screen filter. A large amount of water may be deposited on or in the surface or absorbed in it.

In this case, even if the pellicle space is purged with inert gas, water molecules deposited on the surface or absorbed in it are gradually eliminated into inert gas. It is very difficult to decrease the water concentration in the pellicle space to ppm order within a short time. The water concentration during the purge period can be decreased by increasing the inert gas supply flow rate. Even when purge stops, water elimination continues to gradually increase the water concentration in the narrow pellicle space.

Exposure of a pattern using such a reticle gradually changes the transmittance for exposure light. As a result, a predetermined exposure amount cannot be stably obtained on a wafer, and the size of a pattern transferred to the wafer changes.

To solve this problem, a vent hole may be formed in the reticle frame to forcibly supply inert gas into the pellicle space via the vent hole. In this method, a reticle with a pellicle is aligned at a predetermined position. Assuming that the pellicle frame exists at a predetermined position, an inert gas supply portion is moved close to the pellicle frame. If, however, the pellicle frame shifts from the predetermined position, excessive force is applied to the pellicle frame to deform it.

SUMMARY OF THE INVENTION

The present invention has been made in consideration of the above situation, and has as its object to solve problems caused by misalignment of a pellicle frame at an improper position and to minimize deformation of the pellicle frame when an inert gas supply portion is moved close to the pellicle frame to supply inert gas into the pellicle space.

According to the first aspect of the present invention, there is provided a device manufacturing-related apparatus having a space for storing a reticle with a pellicle whose pellicle film is supported by a pellicle frame, comprising an alignment mechanism which aligns the pellicle frame at a predetermined position.

According to a preferred aspect of the present invention, it is preferable that the reticle with the pellicle have a vent hole in the pellicle frame, and the device manufacturing-related apparatus further comprise an inert gas supply portion which supplies inert gas via the vent hole into a pellicle space serving as a space within the pellicle frame.

According to another preferred aspect of the present invention, the alignment mechanism preferably aligns-the pellicle frame by moving the inert gas supply portion. Alternatively, the alignment mechanism preferably aligns the pellicle frame by using the inert gas supply portion as an alignment reference.

According to still another preferred aspect of the present invention, it is preferable that a distal end of the inert gas supply portion comprise an elastic member, and the alignment mechanism bring the elastic member and the pellicle frame into tight contact with each other in alignment and supplying inert gas. A width of the elastic member in a direction perpendicular to a surface of the pellicle film is preferably substantially equal to a width of the pellicle frame in the direction perpendicular to the surface of the pellicle film.

According to still another preferred aspect of the present invention, the alignment mechanism preferably presses the pellicle frame by a distal end of the inert gas supply portion in alignment and supplying inert gas. The alignment mechanism preferably comprises a sensor which detects force applied to the pellicle frame, and controls, based on an output from the sensor, force for pressing the pellicle frame by the distal end of the inert gas supply portion. The alignment mechanism preferably presses the pellicle frame by the distal end of the inert gas supply portion in a direction parallel to a surface of the pellicle film.

According to still another preferred aspect of the present invention, it is preferable that the reticle with the pellicle have first and second vent holes in the pellicle frame, and the device manufacturing-related apparatus further comprise an inert gas supply portion which supplies inert gas via the first vent hole into a pellicle space serving as a space within the pellicle frame, and an inert gas exhaust portion which exhausts gas in the pellicle space via the second vent hole.

According to still another preferred aspect of the present invention, the alignment mechanism preferably aligns the pellicle frame by moving at least one of the inert gas supply portion and the inert gas exhaust portion. Alternatively, the alignment mechanism preferably aligns the pellicle frame by using either of the inert gas supply portion and the inert gas exhaust portion as an alignment reference. Alternatively, the alignment mechanism preferably aligns the pellicle frame by driving at least one of the inert gas supply portion and the inert gas exhaust portion so as to sandwich the pellicle frame by the inert gas supply portion and the inert gas exhaust portion.

According to still another preferred aspect of the present invention, the alignment mechanism preferably comprises a sensor which detects force applied to the pellicle frame, and controls driving of at least one of the inert gas supply portion and the inert gas exhaust portion on the basis of an output from the sensor.

According to still another preferred aspect of the present invention, the alignment mechanism preferably drives at least one of the inert gas supply portion and the inert gas exhaust portion in a direction parallel to a surface of the pellicle film.

According to still another preferred aspect of the present invention, at least one of the inert gas supply portion and the inert gas exhaust portion is preferably supported pivotally about a shaft perpendicular to a surface of the pellicle film.

According to still another preferred aspect of the present invention, it is preferable that the device manufacturing-related apparatus further comprise a sensor which detects a position of the pellicle frame, and the alignment mechanism align the pellicle frame at the predetermined position on the basis of an output from the sensor.

According to still another preferred aspect of the present invention, the device manufacturing-related apparatus preferably further comprises an exposure section which exposes a substrate with a pattern formed on the reticle.

The device manufacturing-related apparatus can be constituted as an exposure apparatus which exposes a substrate to a pattern formed on the reticle, a gas purge apparatus which purges, with inert gas, gas in the pellicle space serving as a space within the pellicle frame, a reticle stocker which stocks the reticle, a reticle inspection apparatus which inspects the reticle, or a reticle transfer box for transferring the reticle.

According to the second aspect of the present invention, there is provided a gas purge method of purging, with inert gas via a vent hole formed in a pellicle frame, gas in a pellicle space serving as a space within the pellicle frame of a reticle with a pellicle whose pellicle film is supported by the pellicle frame, comprising the steps of aligning the pellicle frame at a predetermined position, and supplying inert gas from an inert gas supply portion into the pellicle space via the vent hole while the inert gas supply portion is in tight contact with the pellicle frame.

According to the third aspect of the present invention, a device is manufactured by using the above-described device manufacturing-related apparatus.

According to the fourth aspect of the present invention, there is provided a device manufacturing method of manufacturing a device through a lithography process, wherein in the lithography process, a pattern is transferred onto a substrate by using the device manufacturing-related apparatus serving as an exposure apparatus.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 15 is a flow chart showing the semiconductor device manufacturing flow.

DETAILED DESCRIPTION OF THE PREFERRED EMBODIMENTS

Figure 1:
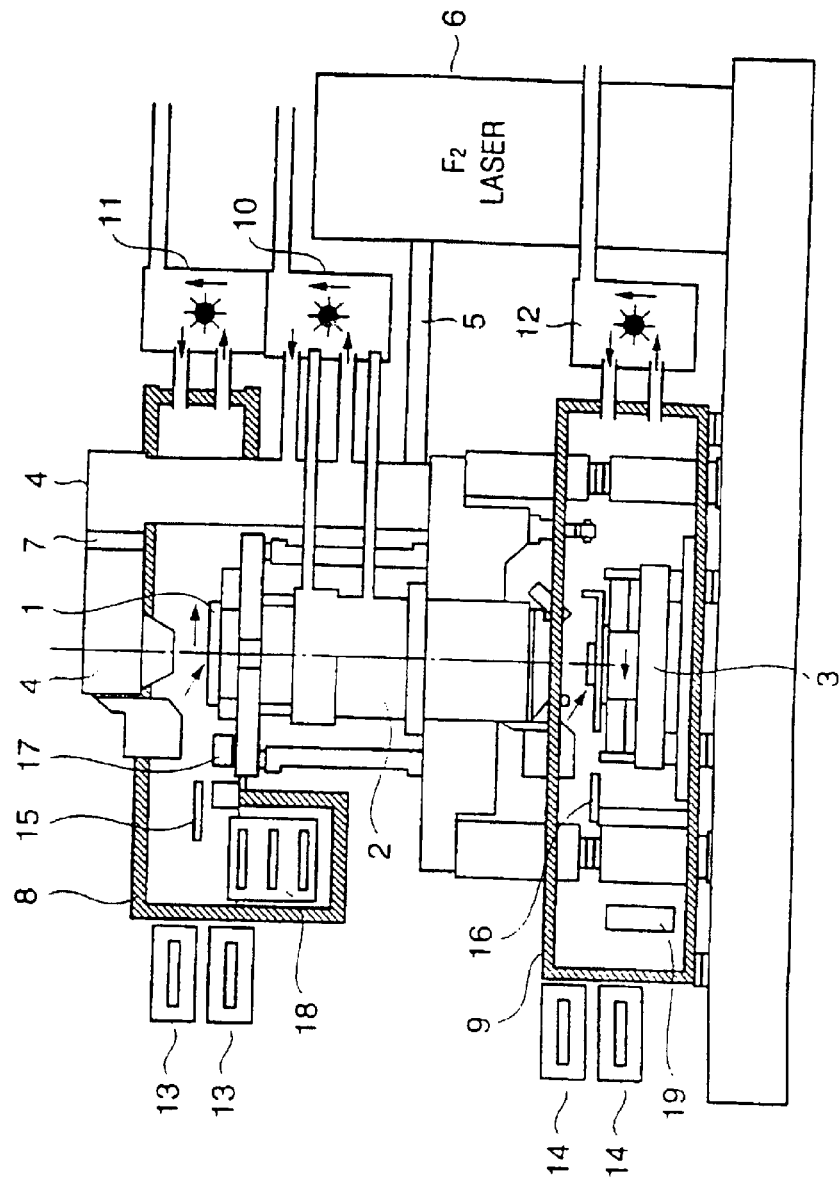
FIG. 1 is a sectional view showing the schematic arrangement of a projection exposure apparatus to which the present invention can be applied.
Figure 2:
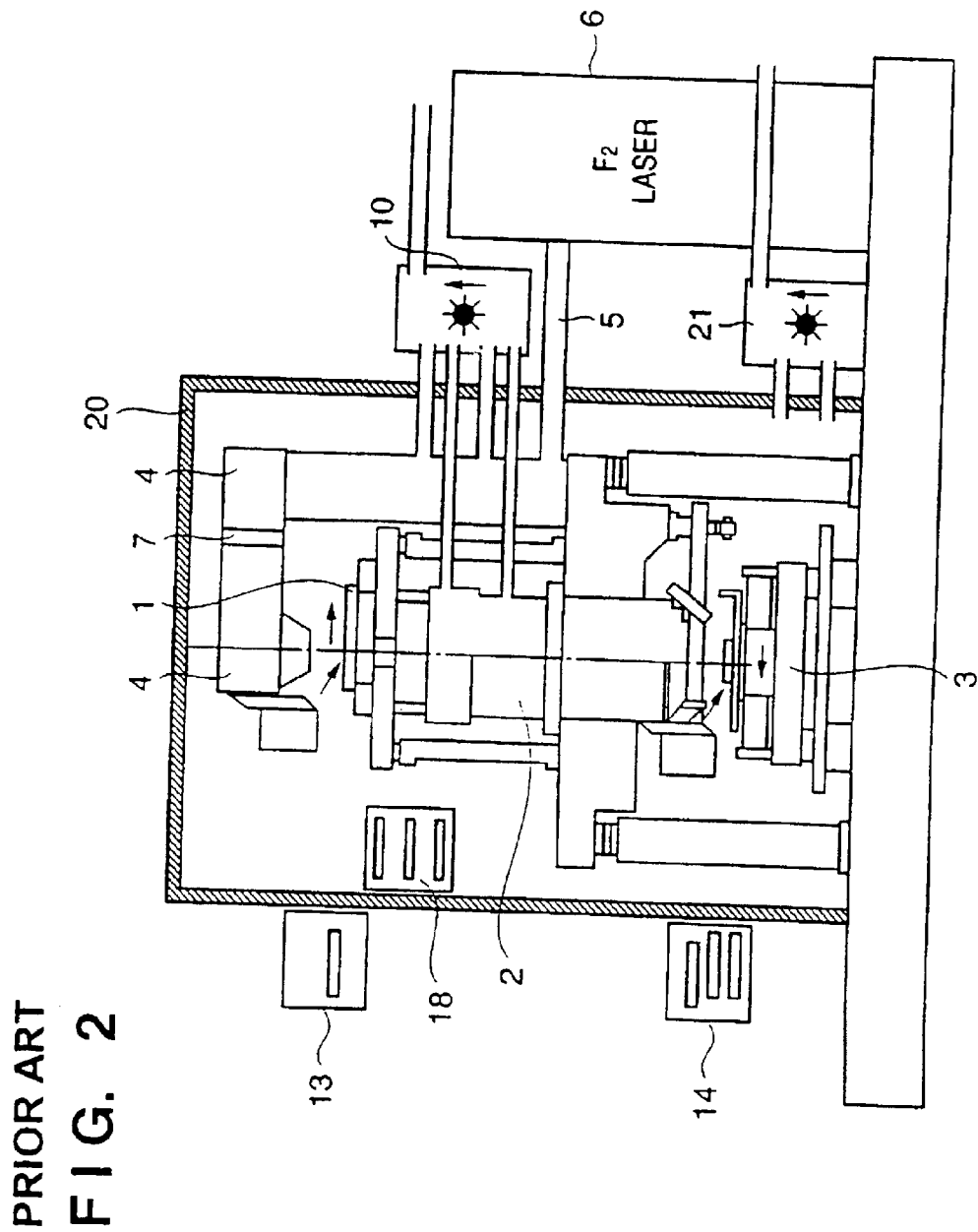
FIG. 2 is a sectional view showing the schematic arrangement of another projection exposure apparatus to which the present invention can be applied.
Figure 3:
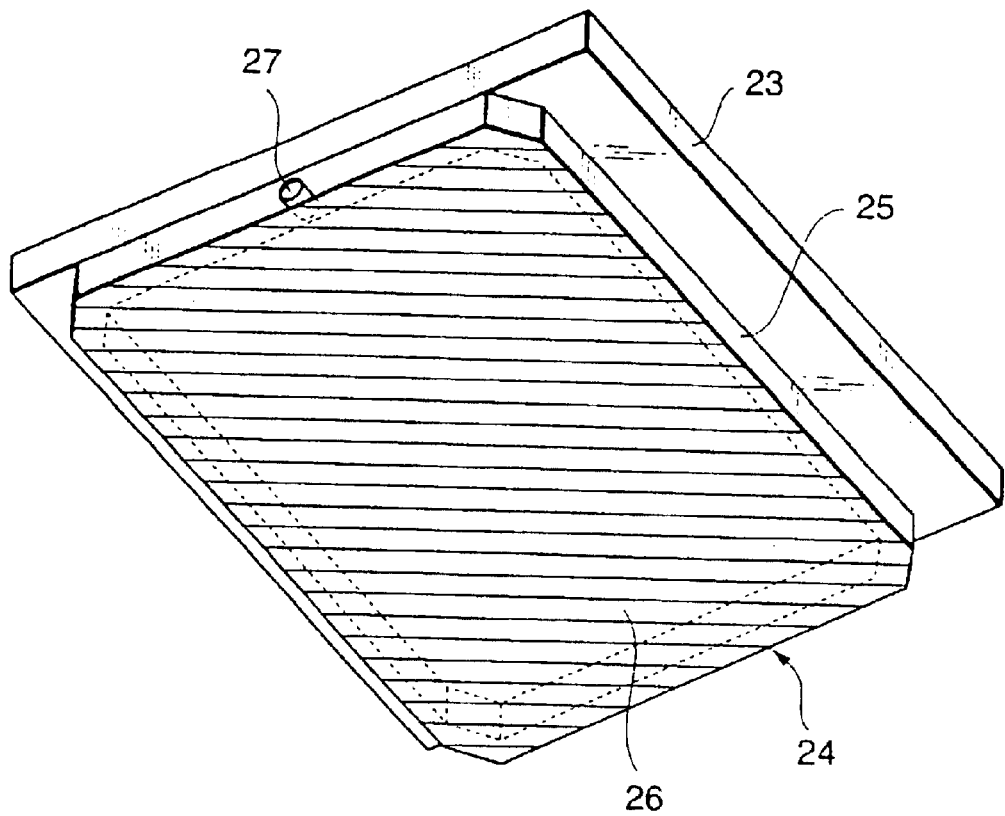
FIG. 3 is a perspective view showing the schematic structure of a reticle with a pellicle.
Figure 4:
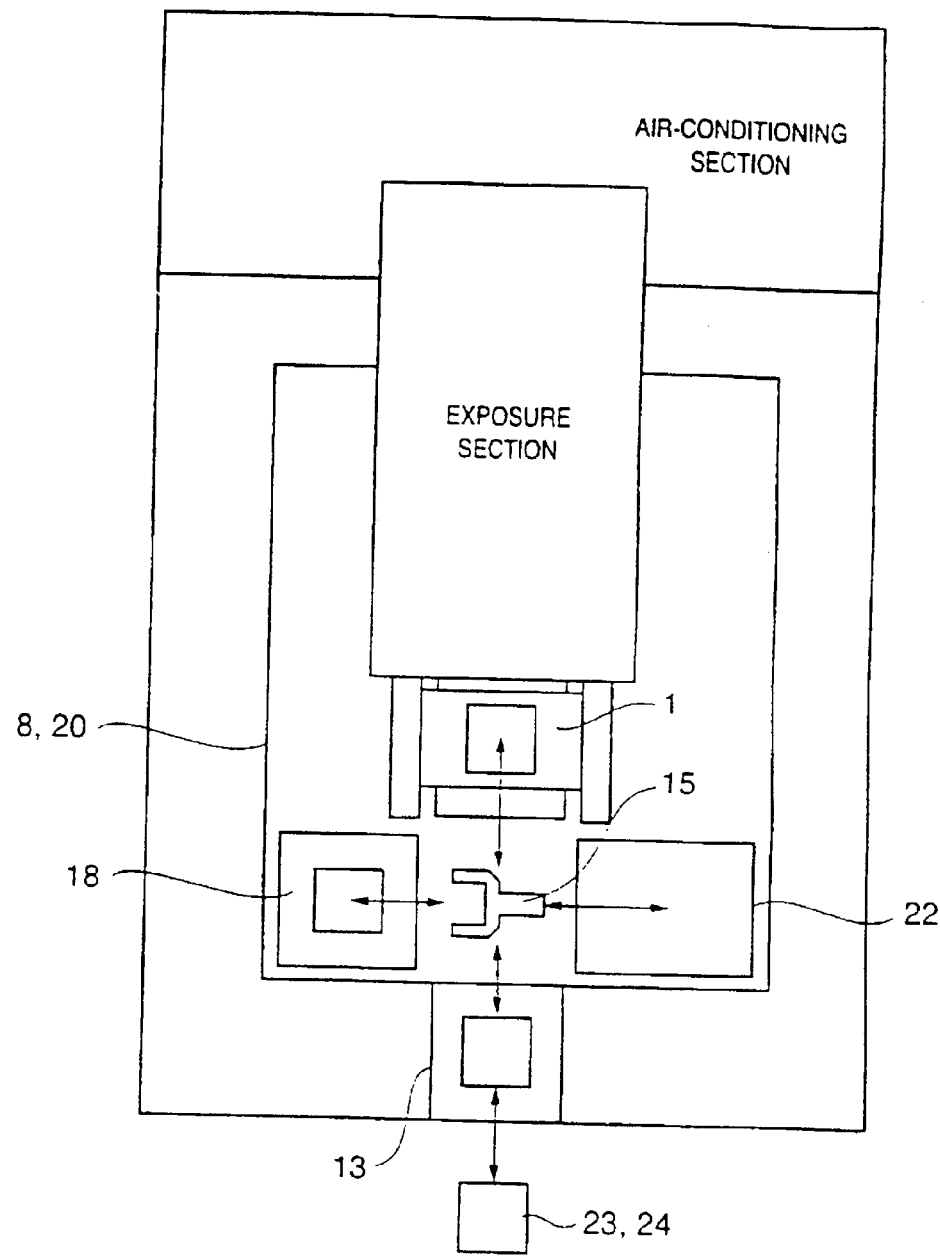
FIG. 4 is a view showing the schematic arrangement of a reticle transfer path in the projection exposure apparatus to which the present invention can be applied.

Preferred embodiments of the present invention are related to an exposure apparatus which projects a reticle pattern onto a photosensitive substrate via a projection optical system by using ultraviolet rays as exposure light. A pellicle frame alignment mechanism and inert gas supply portion are arranged in the exposure apparatus. Inert gas is supplied from the inert gas supply portion into the pellicle space via a vent hole formed in the pellicle frame.

A general adhesive used to adhere a pellicle frame to a reticle is a flexible adhesive so as not to deform the reticle pattern surface by the difference in thermal expansion between the reticle material and the pellicle frame material. The pellicle frame is deformed or peeled by force applied to the adhesive when the reticle portion of a reticle with a pellicle is aligned and fixed, and then an inert gas supply nozzle is pressed against the pellicle.

To prevent this, according to preferred embodiments of the present invention, the pellicle frame is aligned at a predetermined position, and then inert gas is supplied from the inert gas supply portion into the pellicle space via the vent hole formed in the pellicle frame. In this way, the pellicle frame is aligned at the predetermined position for supplying inert gas. This can prevent application of excessive force to the pellicle frame and the adhesive portion between the pellicle frame and the reticle by the inert gas supply portion when supplying inert gas into the pellicle space via the vent hole of the pellicle frame from the inert gas supply portion arranged at a position where it tightly contacts the pellicle frame.

The pellicle frame is preferably aligned while the reticle with the pellicle is movable and the inert gas supply portion abuts against the pellicle frame. In this case, no excessive force is applied to the pellicle frame and the adhesive portion between the pellicle frame and the reticle in aligning the reticle with the pellicle and supplying inert gas into the pellicle space. Deformation or peeling of the pellicle frame can be more effectively prevented.

Assume that the inert gas supply portion and pellicle frame are brought into tight contact with each other and inert gas is to be supplied from the inert gas supply portion to the pellicle space. In this case, when corrugations on the surfaces of the inert gas supply portion and pellicle frame form a gap between the inert gas supply portion and the pellicle frame, inert gas may leak from the gap. The causes of the corrugations are small corrugations and unevenness on the surfaces of the inert gas supply portion and pellicle frame depending on the mechanical processing precision, and the thickness and surface precision of a filter attached to the vent hole of the pellicle frame. A shift (error) between the pellicle frame alignment position and the position of the inert gas supply portion also forms a gap between the pellicle frame and the inert gas supply portion when they are brought into tight contact with each other, and inert gas may leak from the gap.

To prevent this, an elastic member is attached to the distal end of the inert gas supply portion in preferred embodiments of the present invention. The elastic member absorbs corrugations on the surfaces of the inert gas supply portion and pellicle frame, and the positional error between them. The inert gas supply portion and pellicle frame can be brought into tight contact with each other by almost uniform force on the entire contact surface between the inert gas supply portion and the pellicle frame. At this time, the height (width in a direction perpendicular to the pellicle film surface) of the elastic member is set almost equal to the height of the pellicle frame. The stress by deformation of the elastic member upon pressing the inert gas supply portion against the pellicle frame becomes almost uniform at the entire contact portion. The inert gas supply portion and pellicle frame can tight contact each other by almost uniform force at the entire contact portion between the inert gas supply portion and the pellicle frame.

As exposure ultraviolet rays, the exposure apparatus according to preferred embodiments of the present invention can adopt a laser beam such as a fluorine excimer laser beam (wavelength: 157 nm) or ArF excimer laser beam (wavelength: 193 nm) from a laser functioning as a light source.

A preferable example of the inert gas is one selected from, e.g., nitrogen, helium, and argon.

A purge mechanism (gas purge apparatus) having the pellicle frame alignment mechanism can be applied to any exposure apparatus which uses a reticle with a pellicle. The purge mechanism can also be applied to a reticle stocker, reticle inspection apparatus, reticle transfer box, and the like. In other words, the present invention can be applied to various semiconductor manufacturing-related apparatuses which use, process, or inspect a reticle with a pellicle.

Preferred embodiments of the present invention will be described below with reference to the accompanying drawings.

First Embodiment

Figure 5:
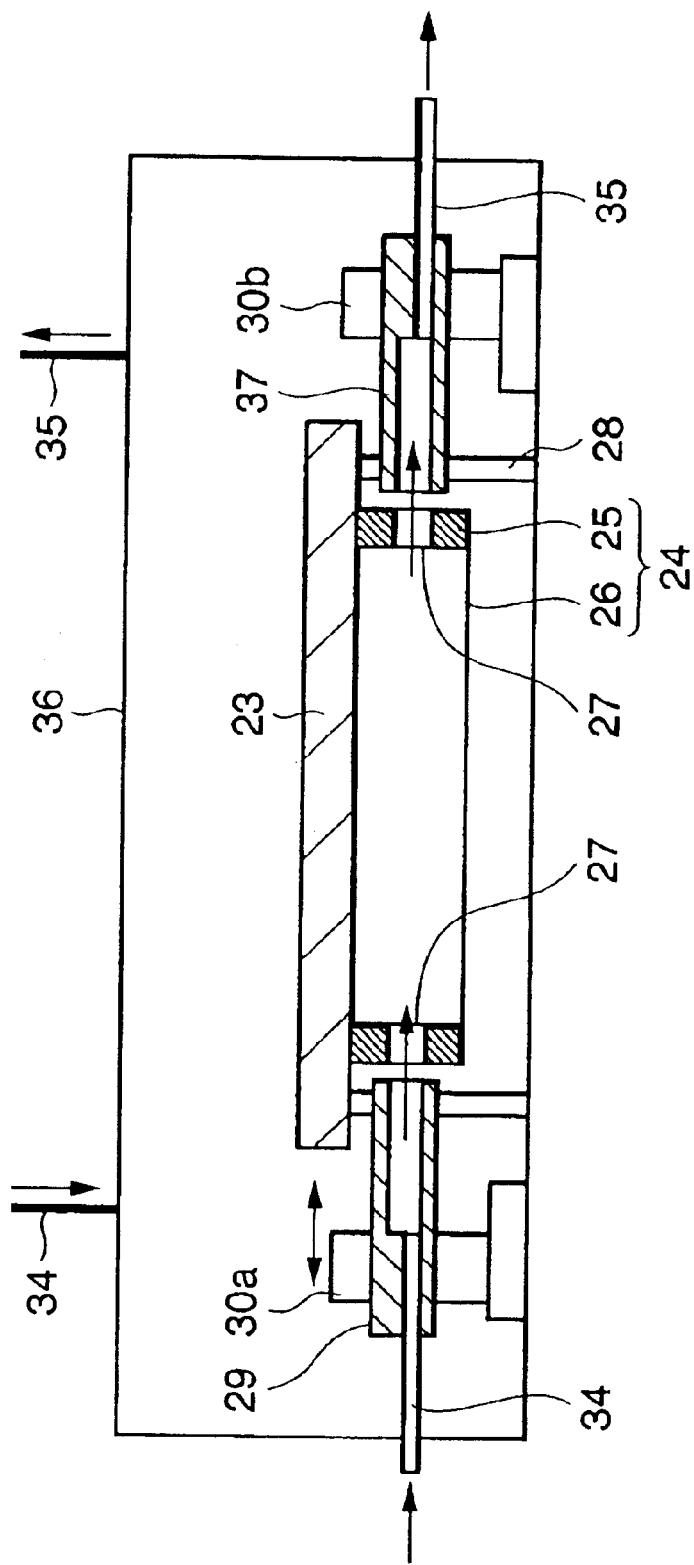
FIG. 5 is a side sectional view showing a purge mechanism according to the first embodiment of the present invention.
Figure 6:
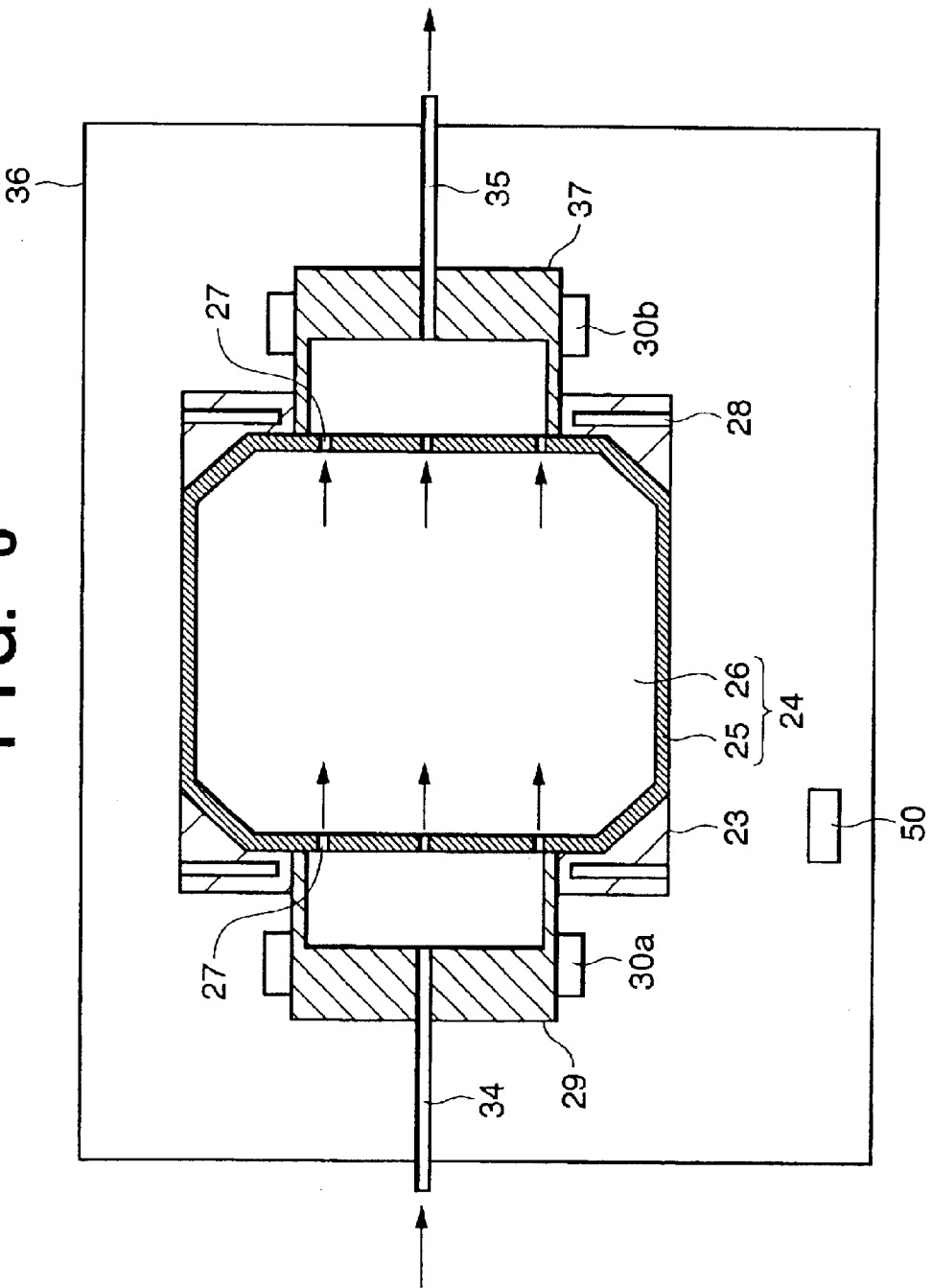
FIG. 6 is a bottom sectional view showing the purge mechanism according to the first embodiment of the present invention.

FIGS. 5 and 6 are views showing a purge mechanism (gas purge apparatus) according to the first embodiment of the present invention. FIG. 5 is a side sectional view, and FIG. 6 is a bottom sectional view. The purge mechanism purges the pellicle space with inert gas.

An airtight chamber 36 in FIGS. 5 and 6 corresponds to a reticle stocker 18, a housing 8 which stores the reticle stocker 18, or a reticle load-lock chamber 13 in FIG. 1. The airtight chamber 36 also corresponds to the housing of a reticle inspection apparatus, a reticle transfer box, or the like.

In the following description, the purge mechanism is stored in the housing 8, i.e., the housing 8 shown in FIG. 1 serves as the airtight chamber 36.

Inert gas is supplied from an inert gas supply portion 29 into the airtight chamber 36, and exhausted from an inert gas exhaust port 35 to purge the interior of the airtight chamber 36 with inert gas. For illustrative convenience, the airtight chamber 36 is drawn small in FIGS. 5 and 6. In practice, the airtight chamber 36 is large enough to store a reticle hand 15, a reticle stage 1, the reticle stocker 18, and the like in FIG. 1. Although not shown FIGS. 5 and 6, the airtight chamber 36 incorporates these members.

Figure 13:
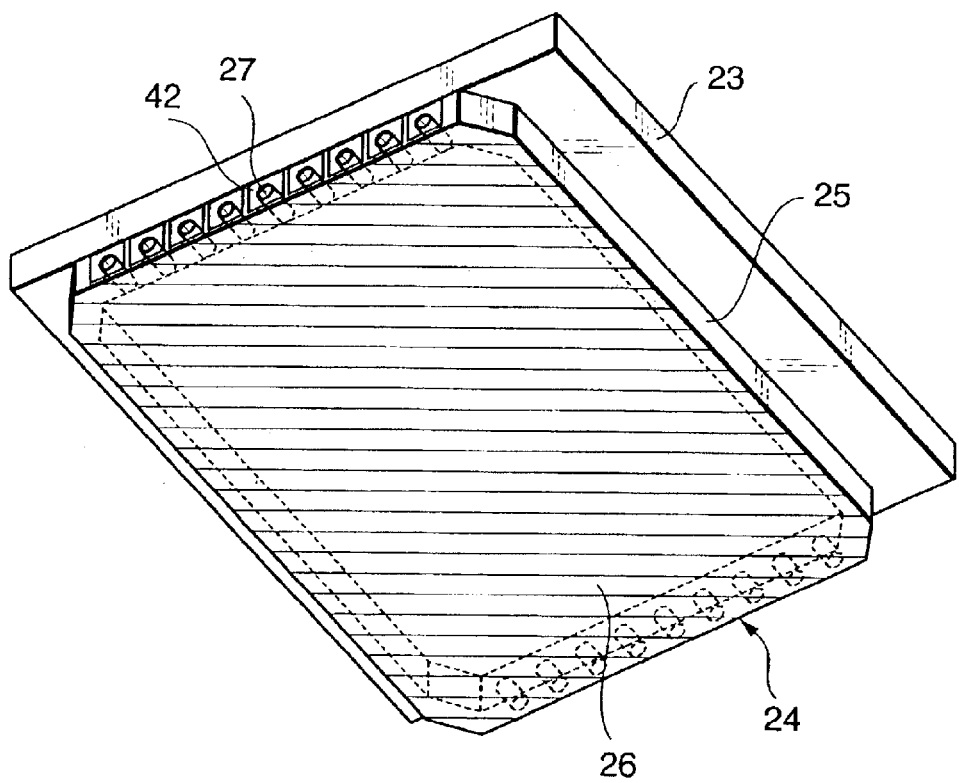
FIG. 13 is a perspective view showing the schematic structure of a reticle with a pellicle.

A reticle support table 28 is arranged in a reticle transfer path in the housing 8 (airtight chamber 36). A reticle (reticle with a pellicle) 23 to which a pellicle 24 is adhered is movably set at a predetermined position on the support table 28 manually or by the reticle hand 15 (see FIG. 1) or a transfer robot (not shown) arranged outside the airtight chamber 36. As shown in FIG. 13, a plurality of vent holes 27 are formed in a pellicle frame 25 of the pellicle 24.

In the airtight chamber 36, the inert gas supply portion 29 (supply nozzle in the first embodiment) and a supply portion driving mechanism 30a are arranged at a predetermined interval along one side of the pellicle frame 25. An inert gas exhaust portion 37 (exhaust nozzle in the first embodiment) and an exhaust portion driving mechanism 30b are arranged at positions where they respectively face the inert gas supply portion 29 and supply portion driving mechanism 30a via the pellicle 24.

The supply portion driving mechanism 30a has a guide and actuator for moving the inert gas supply portion 29 in at least one direction. The supply portion driving mechanism 30a and exhaust portion driving mechanism 30b drive the inert gas supply portion 29 and inert gas exhaust portion 37 so as to sandwich the pellicle frame 25 of the pellicle 24. The pellicle frame 25, inert gas supply portion 29, and inert gas exhaust portion 37 can be relatively so aligned as to bring the inert gas supply portion 29 and inert gas exhaust portion 37 into tight contact with the vent holes 27 of the pellicle frame 25.

By using the pellicle frame 25 as an alignment target, interference between the pellicle frame 25 and the reticle hand 15 can be prevented when the reticle hand 15 transfers the reticle 23 with the pellicle to the reticle stage 1 or the like after purge of the pellicle space.

It is preferable to arrange a sensor 50 which detects the position of the pellicle frame 25, and to control the reticle hand 15 which transfers the reticle 23 with the pellicle 24 on the basis of an output from the sensor 50. This can prevent interference between the pellicle frame 25 and the support table 28 when the reticle 23 with the pellicle is set on the support table 28 by the reticle hand 15. The sensor 50 may be a sensor which senses the pellicle frame 25 by an image sensing device such as a CCD camera and detects the position of the pellicle frame 25, or a sensor (e.g., a laser interferometric measuring unit) which measures the position of the pellicle frame 25 by a laser beam or the like. The sensor 50 may be of another type.

A general adhesive used to adhere a pellicle frame to a reticle is a flexible adhesive so as not to deform the reticle pattern surface by the difference in thermal expansion between the reticle material and the pellicle frame material. If the inert gas supply portion 29 and inert gas exhaust portion 37 are pressed against the pellicle frame 25 after the reticle 23 is aligned and fixed, excessive force is applied to the adhesive to deform or peel the pellicle frame. In the first embodiment, however, the pellicle frame 25 is aligned at a predetermined position while the reticle 23 is free. No excessive force is applied to the adhesive portion between the reticle 23 and the pellicle frame 25, and deformation and peeling of the pellicle frame 25 can be prevented. The pellicle frame 25 is aligned by the inert gas supply portion 29 and inert gas exhaust portion 37. In other words, the distal ends of the inert gas supply portion 29 and inert gas exhaust portion 37 are brought into tight contact with the pellicle frame 25. After that, inert gas is supplied from the inert gas supply portion 29 into the pellicle space, and the atmosphere in the pellicle space is exhausted from the inert gas exhaust portion 37, purging the pellicle space. After purge ends, the reticle with the pellicle is transferred by the reticle hand 15 to the reticle stage 1 or the like.

The process of purging the pellicle space with inert gas will be explained with reference to FIGS. 5 and 6. The reticle 23 to which the pellicle 24 is adhered is movably set at a predetermined position on the reticle support table 28 manually or by the reticle hand 15 or transfer robot. The inert gas supply portion 29 and inert gas exhaust portion 37 stand by at predetermined positions. After or simultaneously when the reticle 23 is set on the reticle support table 28, the driving mechanisms 30a and 30b bring the inert gas supply portion 29 and inert gas exhaust portion 37 into tight contact with sides on which the vent holes 27 of the pellicle frame 25 are formed. Accordingly, the pellicle frame 25 of the reticle 23 with the pellicle is aligned.

Inert gas is supplied from an inert gas supply device (not shown) to the inert gas supply portion 29, and blown into the pellicle space via the vent holes 27 formed in the pellicle frame 25. The blown inert gas is mixed with oxygen, water, or another impurity present in the pellicle space, and exhausted from the vent holes 27 formed in the pellicle frame 25 to the outside via the inert gas exhaust portion 37.

Second Embodiment

The second embodiment of the present invention will be described. Matters which will not be mentioned in the second embodiment are pursuant to the first embodiment.

Figure 7:
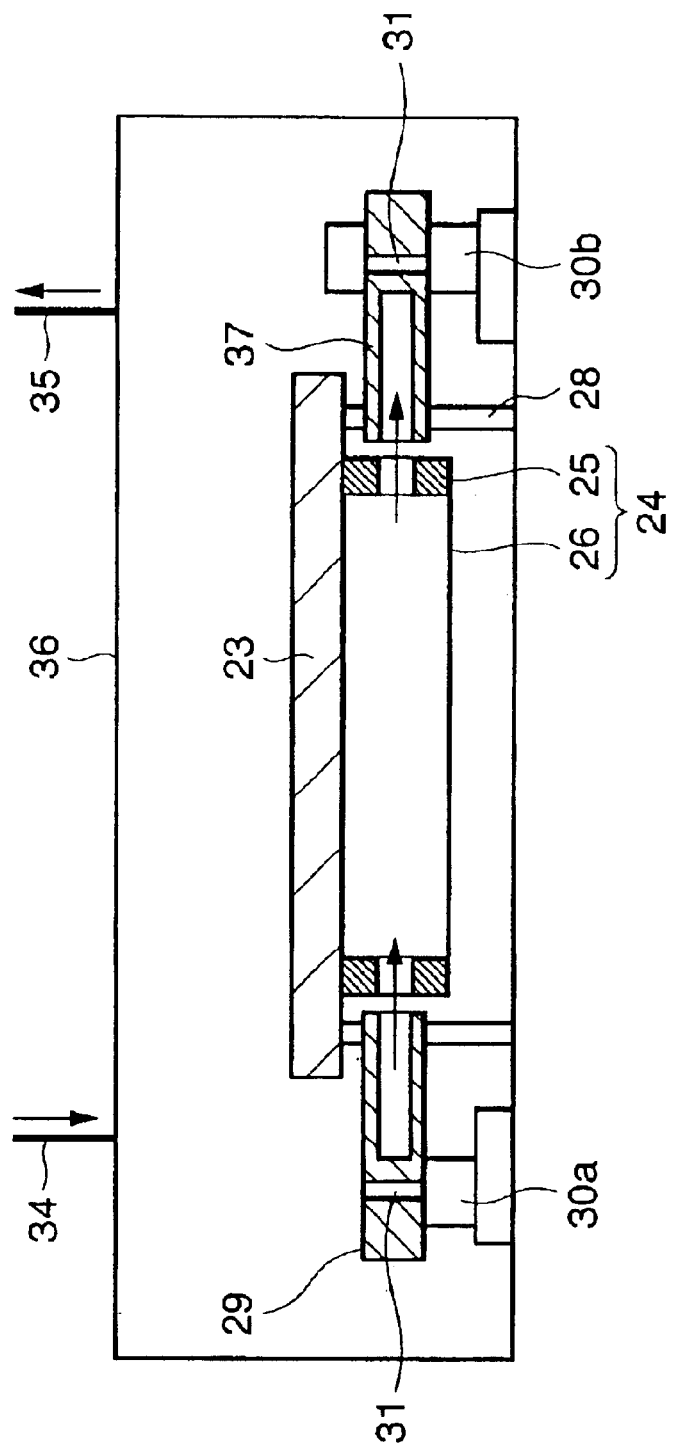
FIG. 7 is a side sectional view showing a purge mechanism according to the second embodiment of the present invention.
Figure 8:
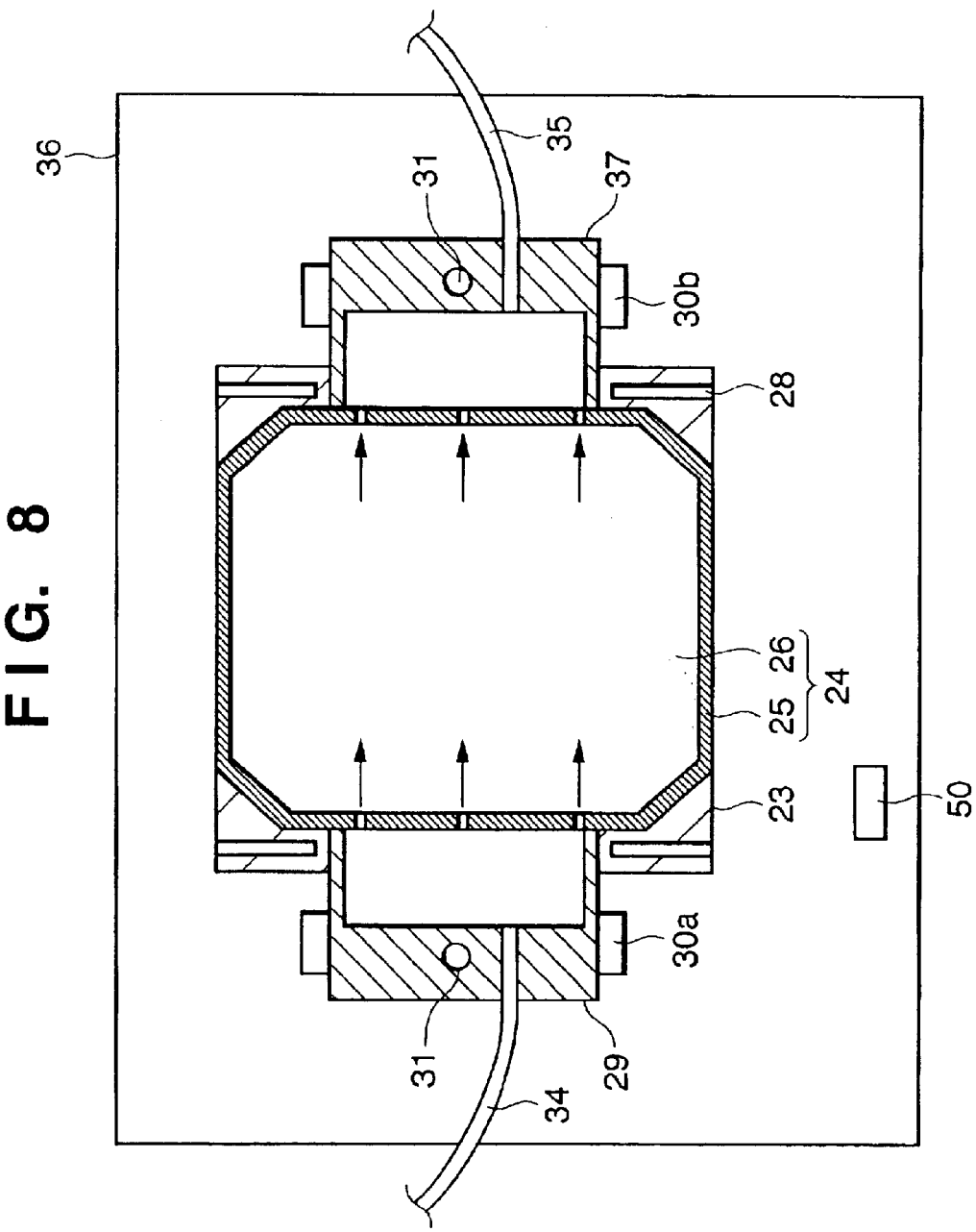
FIG. 8 is a bottom sectional view showing the purge mechanism according to the second embodiment of the present invention.

FIGS. 7 and 8 are views schematically showing a purge mechanism according to the second embodiment of the present invention. FIG. 7 is a side sectional view, and FIG. 8 is a bottom sectional view. One feature of the second embodiment is that an inert gas supply portion 29 and inert gas exhaust portion 37 are arranged freely pivotally about rotating shafts 31. In the first embodiment shown in FIGS. 5 and 6, a gap is formed when the pellicle frame 25 is sandwiched unless the distal ends (pellicle contact surfaces) of the supply portion 29 and exhaust portion 37 are adjusted parallel to the pellicle 24. In the second embodiment, the supply portion 29 and exhaust portion 37 can be pivoted about the rotating shafts 31 so as to make the pellicle contact surfaces of the supply portion 29 and exhaust portion 37 parallel to a pellicle frame 25. No gap is formed without any precise adjustment of the supply portion 29 and exhaust portion 37.

Third Embodiment

The third embodiment of the present invention will be described. Matters which will not be mentioned in the third embodiment are pursuant to the first embodiment.

Figure 9:
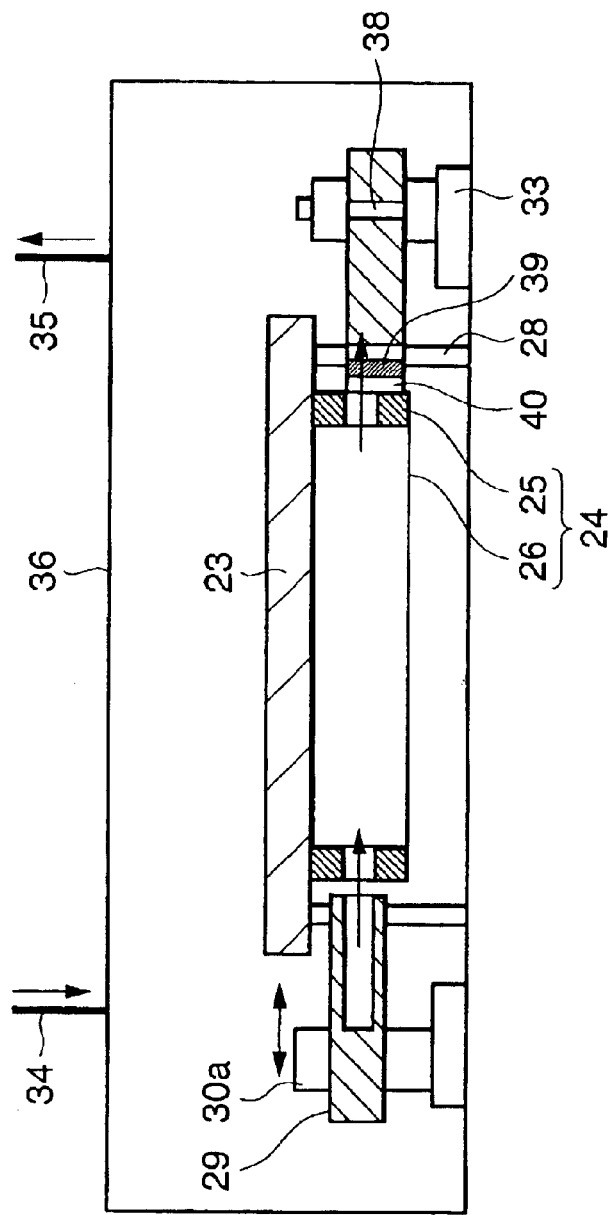
FIG. 9 is a side sectional view showing a purge mechanism according to the third embodiment of the present invention.
Figure 10:
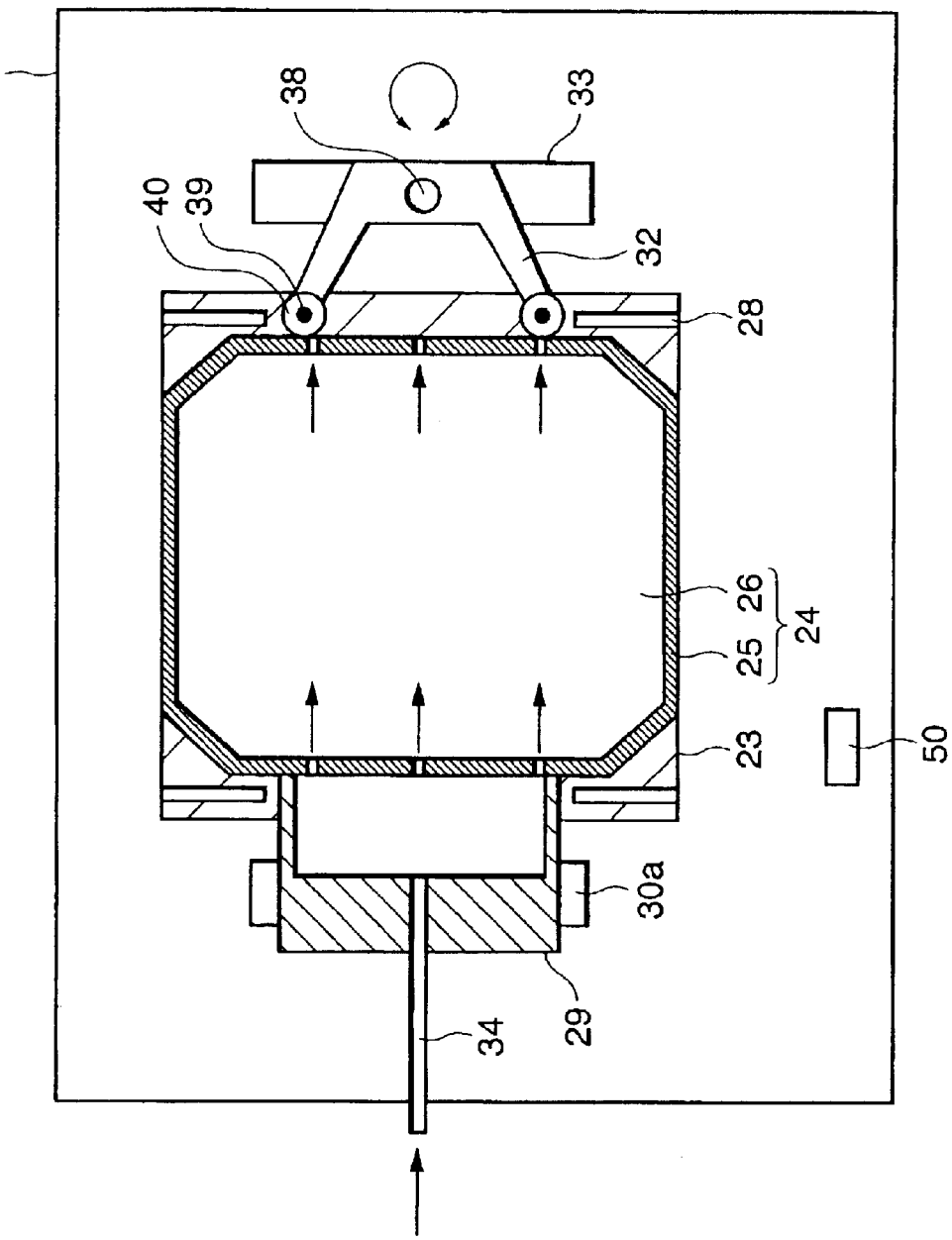
FIG. 10 is a bottom sectional view showing the purge mechanism according to the third embodiment of the present invention.

FIGS. 9 and 10 are views schematically showing a purge mechanism according to the third embodiment of the present invention. FIG. 9 is a side sectional view, and FIG. 10 is a bottom sectional view. One feature of the third embodiment is that a pellicle frame 25 is aligned using the distal end (pellicle contact surface) of an inert gas supply portion 29 as an alignment reference.

An inert gas exhaust portion (in this embodiment, a press mechanism which presses the pellicle frame) 32 and an exhaust portion driving mechanism 33 which drives the exhaust portion 32 are arranged on a side opposite to the inert gas supply portion (in this embodiment, a supply nozzle) 29 and a supply portion driving mechanism 30a via a pellicle 24. The supply portion driving mechanism 30a and exhaust portion driving mechanism 33 have guides and actuators for moving the inert gas supply portion 29 and inert gas exhaust portion 32 in at least one direction. The supply portion driving mechanism 30a advances the inert gas supply portion 29 by a force stronger than that of the exhaust portion driving mechanism 33, thereby aligning the pellicle frame 25 at a reference position.

In the third embodiment, the supply portion driving mechanism 30a has a spring (not shown). The spring force presses the inert gas supply portion 29 against the pellicle frame 25. The exhaust portion driving mechanism 33 on the opposite side has a spring (not shown) weaker than that of the supply portion driving mechanism 30a. The spring force presses the inert gas exhaust portion 32 against the pellicle frame 25. Even application of force to the pellicle frame 25 by the inert gas exhaust portion 32 does not shift the position of the inert gas supply portion 29. The inert gas supply portion 29 serves as a reference for aligning the pellicle frame 25.

As described above, according to the third embodiment, the pellicle 24 can be aligned using the distal end of the inert gas supply portion 29 as a reference so as to bring the distal ends of the inert gas supply portion 29 and inert gas exhaust portion 32 into tight contact with portions of the pellicle frame 25 where vent holes 27 are formed. Since the pellicle frame 25 is set as an alignment target, interference between the pellicle frame 25 and the reticle hand 15 can be prevented when a reticle hand 15 transfers a reticle 23 with the pellicle 24 to a reticle stage 1 or the like after purge of the pellicle space.

It is preferable to arrange a sensor 50 which detects the position of the pellicle frame 25, and to control the reticle hand 15 which transfers the reticle 23 with the pellicle 24 on the basis of an output from the sensor 50. This can prevent interference between the pellicle frame 25 and a support table 28 when the reticle 23 with the pellicle is set on the support table 28.

In the third embodiment, the pellicle frame 25 is aligned using the inert gas supply portion 29 as a reference by setting the spring constant of the spring attached to the supply portion driving mechanism 30a much larger than that of the spring attached to the exhaust portion driving mechanism 33. This is merely an implementation of the present invention. For example, the pellicle frame 25 may be aligned using the gas exhaust portion 32 as a reference by setting the spring constant of the spring attached to the supply portion driving mechanism 30a much smaller than that of the spring attached to the exhaust portion driving mechanism 33. Alternatively, the inert gas supply portion 29 may be replaced with a gas exhaust portion, and the inert gas exhaust portion 32 may be replaced with a gas supply portion.

In the third embodiment, the spring applies press force to the pellicle frame 25. Alternatively, e.g., a pressure sensor which detects press force may be arranged, and the press force to the pellicle frame 25 may be controlled by controlling the driving mechanisms 30a and 33 on the basis of an output from the sensor.

The inert gas exhaust portion 32 is attached freely pivotally about a rotating shaft 38. Bearings 39 are attached to the distal ends (pellicle contact portions) of the inert gas exhaust portion 32, and circular resin members 40 are attached to the outer rings of the bearings 39. The resin member 40 is made of a material which hardly generates dust by contact. The resin member 40 is desirably formed from PEEK, PES, polyacetal, or fluoroplastic.

The process of purging the pellicle space with inert gas will be explained with reference to FIGS. 9 and 10. The reticle 23 to which the pellicle 24 is adhered is movably set at a predetermined position on the reticle support table 28 manually or by the reticle hand 15 or transfer robot. The inert gas supply portion 29 stands by at a predetermined position. After or simultaneously when the reticle 23 with the pellicle is set on the reticle support table 28, the driving mechanism 30a aligns the inert gas supply portion 29 at the alignment reference position of the pellicle frame 25.

Figure 11:
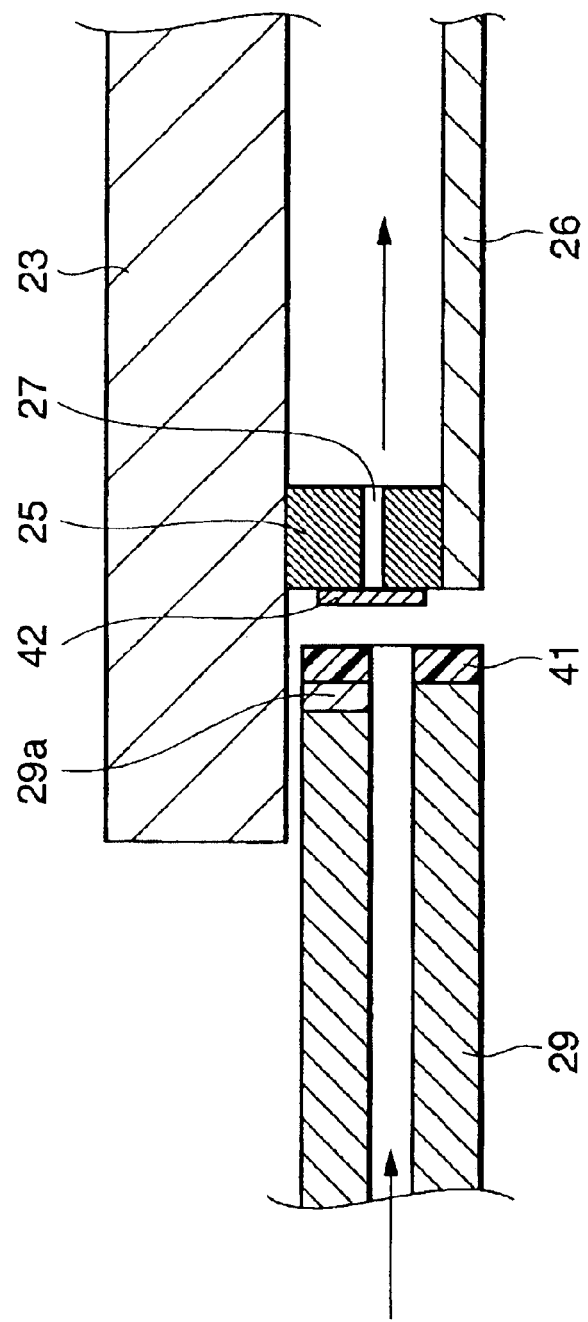
FIG. 11 is a schematic view showing an arrangement in which an elastic member is attached to the distal end of a nozzle.

The inert gas exhaust portion 32 is moved toward the pellicle 24 by the driving mechanism 33, and presses the pellicle frame 25 against the inert gas supply portion 29 serving as an alignment reference. At this press, the reticle 23 with the pellicle contacts the entire inert gas supply portion 29 while rotating at a point as a fulcrum where the reticle 23 first contacts the inert gas supply portion 29. Hence, no dust is generated by sliding the inert gas supply portion 29 and pellicle frame 25. The pellicle frame 25 and inert gas exhaust portion 32 also press each other while the bearing 39 slightly rolls at their contact portion. No dust generated by sliding deposits on the surfaces of the pellicle frame 25 and pellicle 24, and no defect common to devices is generated by deposition. The arrangement in which the distal end of the inert gas supply portion 29 and the pellicle frame 25 do not slide is preferable because an elastic member 41 with a large friction can be attached to the distal end of the inert gas supply portion 29, as shown in FIG. 11. The pellicle frame 25 can be reliably pressed by attaching the distal end of the inert gas supply portion 29.

After the inert gas supply portion 29 and exhaust portion driving mechanism 33 are brought into tight contact with the pellicle frame 25, inert gas is supplied from an inert gas supply device (not shown) to the inert gas supply portion 29. The inert gas is blown into the pellicle space via the vent holes 27 formed in the pellicle frame 25. The blown inert gas is mixed with oxygen, water, or another impurity present in the pellicle space, and exhausted to the upper and lower portions within the inert gas exhaust portion 32 via the vent holes 27 formed in the pellicle frame 25.

In this fashion, the inert gas supply portion 29 is used as an alignment reference, and the pellicle frame 25 is pressed against the inert gas supply portion 29. This realizes clean, reliable press.

Also in the third embodiment, the inert gas supply portion 29 may be replaced with a gas exhaust portion, and the inert gas exhaust portion 32 may be replaced with a gas supply portion.

Common Matter

An arrangement commonly applicable to the first to third embodiments will be described.

Prevention of gas leakage when the inert gas supply portion 29 and pellicle frame 25 are brought into tight contact with each other and inert gas is supplied into the pellicle space will be explained. FIG. 11 is a schematic view showing an arrangement in which the elastic member 41 is attached to the distal end of the inert gas supply portion 29. The elastic member 41 is fixed to the distal end of the inert gas supply portion 29. A dustproof filter 42 is adhered to the vent holes 27 formed in the pellicle frame 25. The elastic member 41 is so arranged as to form a small gap with the lower surface of the reticle 23. The height (width in a direction perpendicular to the surface of the pellicle film 26) is almost the same as, e.g., the height of the pellicle frame 25.

In general, the surfaces of the inert gas supply portion 29 and pellicle frame 25 are corrugated. The corrugations form a gap when the inert gas supply portion 29 and pellicle frame 25 are brought into tight contact with each other, and inert gas may leak from the gap. The causes of the corrugations are small corrugations and unevenness on the surfaces of the inert gas supply portion 29 and pellicle frame 25 by mechanical processing, and the thickness and surface precision of the filter 42 attached to the vent holes 27 of the pellicle frame 25.

From this, the elastic member 41 is preferably attached to the distal end of the inert gas supply portion 29. The elastic member 41 absorbs any positional error and corrugations at the distal end of the inert gas supply portion 29 and on the surface of the pellicle frame 25. The inert gas supply portion 29 and pellicle frame 25 can tightly contact each other by almost uniform force on the whole contact surface between the distal end of the inert gas supply portion 29 and the pellicle frame 25, efficiently reducing leakage of inert gas. The elastic member 41 is desirably made of, e.g., fluororubber or fluororubber sponge selected from a rubber or sponge with a rubber hardness of 60 or less. Adhesion between the inert gas supply portion 29 and the elastic member 41 should adopt an adhesive almost free from any organic substance, and is desirably vulcanization adhesion or baking adhesion.

Figure 12:
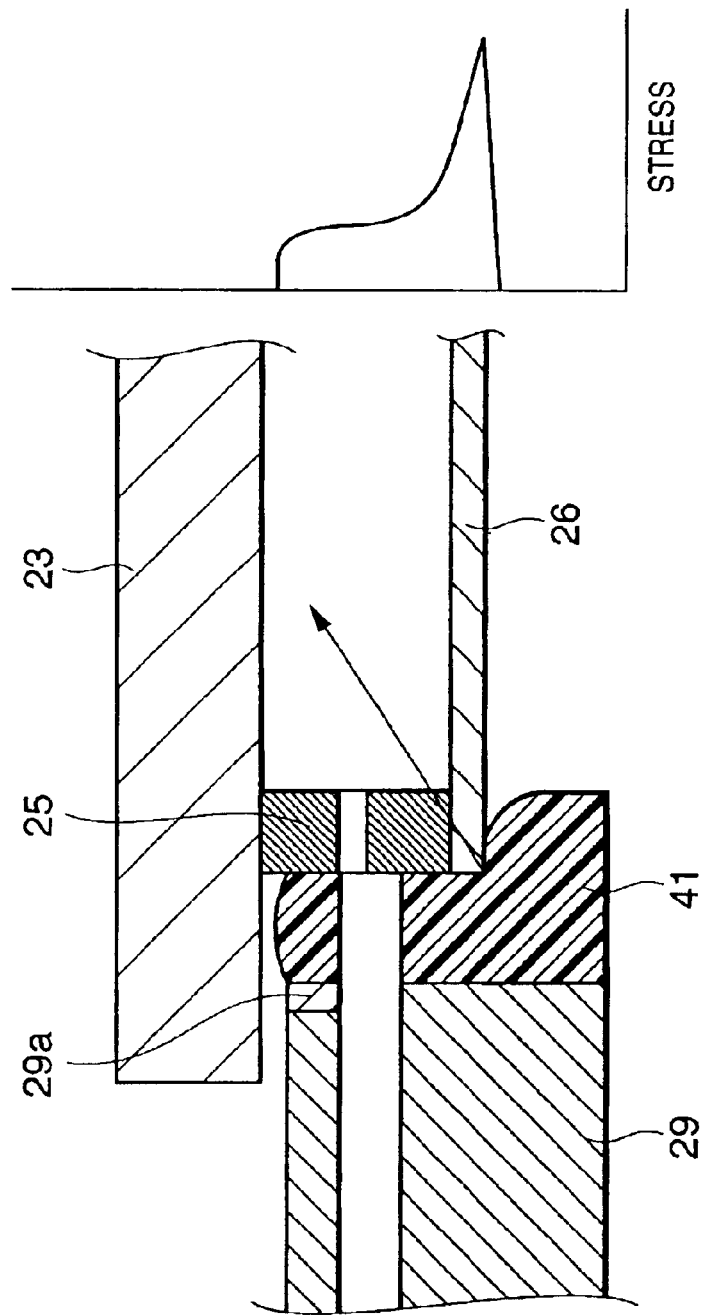
FIG. 12 is a schematic view showing a state where an elastic member different in vertical width from a pellicle frame is pressed against the pellicle frame to deform it.

FIG. 12 is a schematic view showing a state where the elastic member 41 with a height larger than the height (width in a direction perpendicular to the surface of the pellicle film 26) of the pellicle frame 25 is pressed and deformed. The lower end of the pellicle frame 25 is dug in the elastic member 41 and greatly deforms it. The stress by deformation of the elastic member 41 becomes nonuniform in the direction of height (direction perpendicular to the surface of the pellicle film 26). The stress maximizes at the lower end of the pellicle frame 25, i.e., the portion where the pellicle frame 25 is dug in the elastic member 41. The average deformation amount of the whole elastic member 41 in the direction of height (direction perpendicular to the surface of the pellicle film 26) becomes smaller than that in FIG. 11. As a result, inert gas readily leaks due to insufficient press. In addition, the stress concentrated at the lower end of the pellicle frame 25 may lift the pellicle or deform the inert gas supply portion 29. Inert gas readily leaks from the contact portion between the pellicle frame 25 and the distal end of the inert gas supply portion 29.

If, however, the height of the elastic member 41 is set almost equal to that of the pellicle frame 25, as shown in FIG. 11, the stress by deformation of the elastic member 41 when the inert gas supply portion 29 is pressed against the pellicle frame 25 becomes almost uniform. The distal end of the inert gas supply portion 29 and the pellicle frame 25 tightly contact each other by almost uniform force on the whole contact surface.

To prevent application of excessive force to the pellicle frame 25 by the inert gas supply portion 29 (and inert gas exhaust portion 37), it is preferable to arrange a pressure sensor (e.g., a piezoelectric element) 29a which detects force applied to the pellicle frame 25 by the inert gas supply portion 29 (and inert gas exhaust portion 37), and to control the driving mechanism 30a on the basis of an output from the pressure sensor 29a.

In the above embodiments, both the inert gas supply portion and inert gas exhaust portion are moved and brought into tight contact with the pellicle frame. Alternatively, either the inert gas supply portion or inert gas exhaust portion may be moved.

In the above embodiments, the pellicle is aligned by bringing the pellicle and the inert gas supply portion and exhaust portion serving as an alignment mechanism into tight contact with each other. Alternatively, the pellicle may be aligned in a noncontact manner using force for blowing inert gas or magnetic force. For example, inert gas is blown to the reticle from its lower side to float the reticle. In this state, the pellicle position is measured in a noncontact manner by a photoelectric sensor, CCD, ultrasonic sensor, or the like. Inert gas is further blown to the pellicle from its side to align the horizontal direction of the pellicle in a noncontact manner. Instead of blowing inert gas to the pellicle from its side, a magnet may be used to achieve noncontact alignment. After alignment, the inert gas supply nozzle is moved close to the vent holes of the pellicle frame and supplies inert gas, realizing noncontact purge.

In the above embodiments, the purge mechanism in the pellicle space according to the present invention is arranged in the semiconductor exposure apparatus. The purge mechanism in the pellicle space according to the present invention may be arranged in an apparatus other than the semiconductor exposure apparatus, for example, in a reticle stocker for stocking reticles or a reticle inspection apparatus in the clean room of a device manufacturer, or a reticle transfer box for transferring reticles in the clean room. Since the inert gas supply portion and pellicle frame are brought into tight contact with each other by almost uniform force on the overall contact surface, the pellicle space can be filled with inert gas while deformation or peeling of the pellicle frame is prevented. When a reticle with a pellicle is transferred into the exposure apparatus from the reticle stocker, reticle inspection apparatus, reticle transfer box, or the like, the time to purge the pellicle space in the exposure apparatus can be shortened to increase the productivity. By always keeping the reticle pattern surface in an inert gas atmosphere, contamination by an organic substance, water, or the like can be prevented.

Device Manufacturing Method

Figure 14:
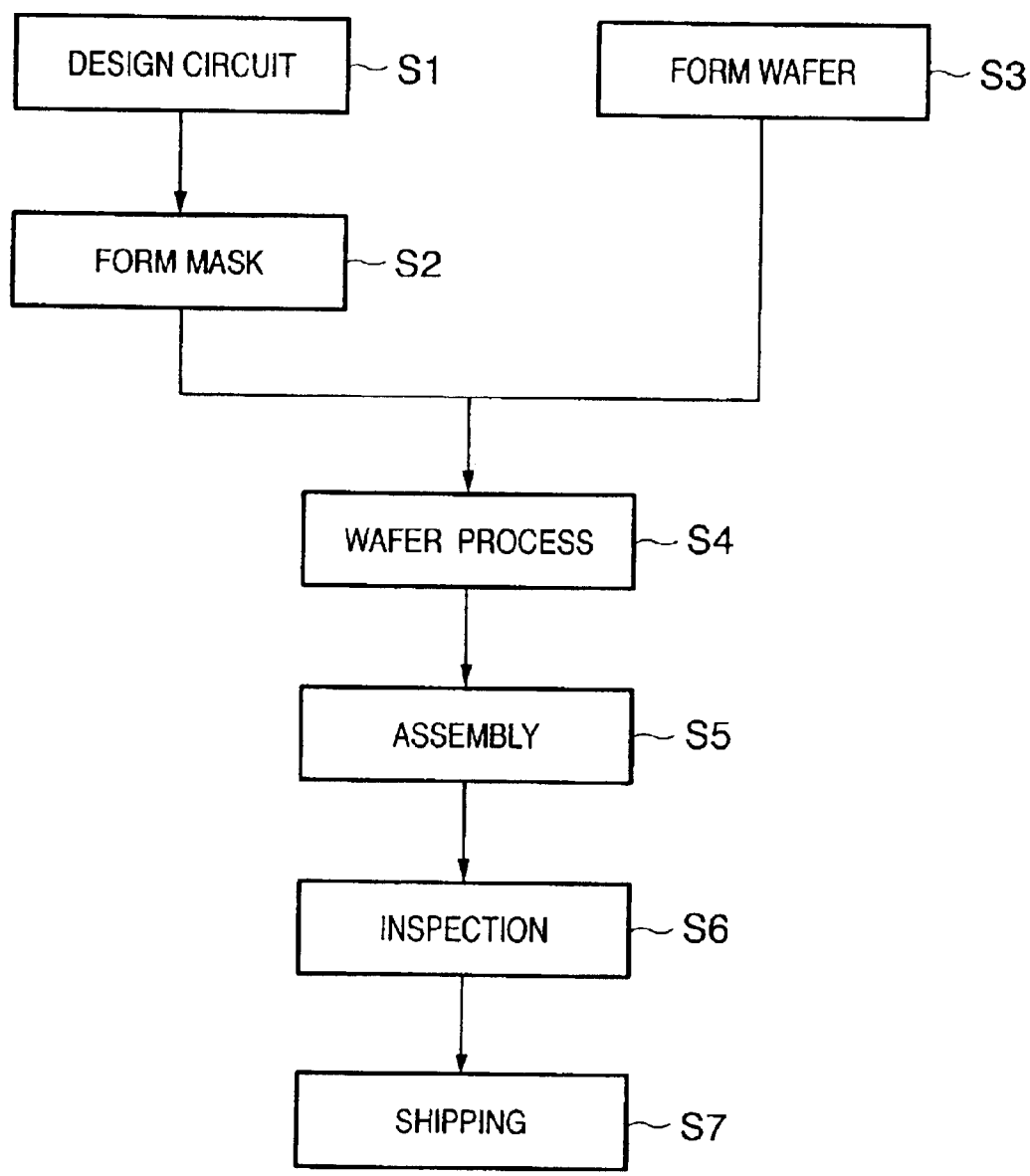
FIG. 14 is a flow chart showing a semiconductor device manufacturing flow.

A semiconductor device manufacturing process using the above-described exposure apparatus will be explained. FIG. 14 shows the flow of the whole manufacturing process of a semiconductor device. In step 1 (circuit design), a semiconductor device circuit is designed. In step 2 (mask formation), a mask is formed based on the designed circuit pattern. In step 3 (wafer formation), a wafer is formed using a material such as silicon. In step 4 (wafer process) called a pre-process, an actual circuit is formed on the wafer by lithography using the mask and wafer. Step 5 (assembly) called a post-process is the step of forming a semiconductor chip by using the wafer formed in step 4, and includes an assembly process (dicing and bonding) and packaging process (chip encapsulation). In step 6 (inspection), the semiconductor device manufactured in step 5 undergoes inspections such as an operation confirmation test and durability test. After these steps, the semiconductor device is completed and shipped (step 7).

FIG. 15 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus transfers a circuit pattern to the wafer. In step 17 (developing), the exposed wafer is developed. In step 18 (etching), the resist is etched except the developed resist image. In step 19 (resist removal), an unnecessary resist after etching is removed. These steps are repeated to form multiple circuit patterns on the wafer.

According to the preferred embodiments of the present invention, a projection exposure apparatus whose light source is an ultraviolet source such as a fluorine excimer laser can efficiently perform inert gas purge within a short time in the pellicle space of a reticle with a pellicle that is transferred into the apparatus. Exposure can be stably controlled with high precision without decreasing the productivity of the exposure apparatus, and a fine circuit pattern can be stably projected with high quality.

While the reticle with the pellicle is movable, the pellicle frame is aligned at a predetermined position for supplying inert gas. Thereafter, inert gas is supplied into the pellicle space via a vent hole formed in the pellicle frame from the inert gas supply portion arranged at a position where it tightly contacts the pellicle frame. This can prevent deformation of the pellicle frame in purge.

The present invention can solve problems caused by misalignment of the pellicle frame at an improper position.

More specifically, the present invention can minimize deformation of the pellicle frame when the inert gas supply portion is brought into tight contact with the pellicle frame to supply inert gas into the pellicle space.

As many apparently widely different embodiments of the present invention can be made without departing from the spirit and scope thereof, it is to be understood that the invention is not limited to the specific embodiments thereof except as defined in the claims.

What is claimed is:

1. A device manufacturing-related apparatus having a space for storing a reticle with a pellicle whose pellicle film is supported by a pellicle frame, the apparatus comprising an alignment mechanism arranged to align the pellicle frame at a predetermined position.

2. The apparatus according to claim 1, wherein
the reticle with the pellicle has a vent hole in the pellicle frame, and
the apparatus further comprises an inert gas supply portion supplying inert gas via the vent hole into a pellicle space serving as a space within the pellicle frame.

3. The apparatus according to claim 2, wherein the alignment mechanism is further arranged to align the pellicle frame by moving the inert gas supply portion.

4. The apparatus according to claim 2, wherein the alignment mechanism is further arranged to align the pellicle frame by using the inert gas supply portion as an alignment reference.

5. The apparatus according to claim 3, wherein
a distal end of the inert gas supply portion comprises an elastic member,
the alignment mechanism is further arranged to align the pellicle frame by bringing the elastic member into tight contact with the pellicle frame, and
inert gas is supplied while the elastic member is in tight contact with the pellicle frame.

6. The apparatus according to claim 5, wherein a width of the elastic member in a direction perpendicular to a surface of the pellicle film is substantially equal to a width of the pellicle frame in the direction perpendicular to the surface of the pellicle film.

7. The apparatus according to claim 3, wherein
the alignment mechanism is further arranged to align the pellicle frame by pressing a distal end of the inert gas supply portion against the pellicle frame, and
inert gas is supplied while the distal end is pressed against the pellicle frame.

8. The apparatus according to claim 7, wherein
the alignment mechanism comprises a sensor arranged to detect force applied to the pellicle frame, and
the alignment mechanism is further arranged to control, based on an output from the sensor, force for pressing the distal end of the inert gas supply portion against the pellicle frame.

9. The apparatus according to claim 7, wherein the alignment mechanism is further arranged to press the distal end of the inert gas supply portion against the pellicle frame in a direction parallel to a surface of the pellicle film.

10. The apparatus according to claim 1, wherein
the reticle with the pellicle has first and second vent holes in the pellicle frame, and
the apparatus further comprises
an inert gas supply portion supplying inert gas via the first vent hole into a pellicle space serving as a space within the pellicle frame, and
an inert gas exhaust portion exhausting gas in the pellicle space via the second vent hole.

11. The apparatus according to claim 10, wherein the alignment mechanism is further arranged to align the pellicle frame by moving at least one of the inert gas supply portion and the inert gas exhaust portion.

12. The apparatus according to claim 10, wherein the alignment mechanism is further arranged to align the pellicle frame by using either of the inert gas supply portion and the inert gas exhaust portion as an alignment reference.

13. The apparatus according to claim 11, wherein the alignment mechanism is further arranged to align the pellicle frame by driving at least one of the inert gas supply portion and the inert gas exhaust portion so as to sandwich the pellicle frame by the inert gas supply portion and the inert gas exhaust portion.

14. The apparatus according to claim 13, wherein the alignment mechanism comprises a sensor arranged to detect force applied to the pellicle frame, and the alignment mechanism is further arranged to control driving of at least one of the inert gas supply portion and the inert gas exhaust portion on the basis of an output from the sensor.

15. The apparatus according to claim 13, wherein the alignment mechanism is further arranged to drive at least one of the inert gas supply portion and the inert gas exhaust portion in a direction parallel to a surface of the pellicle film.

16. The apparatus according to claim 10, wherein at least one of the inert gas supply portion and the inert gas exhaust portion is supported pivotally about a shaft, the shaft being perpendicular to a surface of the pellicle film.

17. The apparatus according to claim 1, wherein
the apparatus further comprises a sensor arranged to detect a position of the pellicle frame, and
the alignment mechanism is further arranged to align the pellicle frame at the predetermined position on the basis of an output from the sensor.

18. The apparatus according to claim 1, further comprising an exposure section arranged to expose a substrate with a pattern formed on the reticle.

19. The apparatus according to claim 1, wherein the apparatus is constituted as an exposure apparatus which exposes a substrate with a pattern formed on the reticle.

20. The apparatus according to claim 1, wherein the apparatus is constituted as a gas purge apparatus which purges, with inert gas, gas in the pellicle space serving as a space within the pellicle frame.

21. The apparatus according to claim 1, wherein the apparatus is constituted as a reticle stocker which stocks the reticle.

22. The apparatus according to claim 1, wherein the apparatus is constituted as a reticle inspection apparatus which inspects the reticle.

23. The apparatus according to claim 1, wherein the apparatus is constituted as a reticle transfer box for transferring the reticle.

24. A gas purge method of purging, with inert gas via a vent hole formed in a pellicle frame, gas in a pellicle space serving as a space within the pellicle frame of a reticle with a pellicle whose pellicle film is supported by the pellicle frame, the method comprising the steps of:
aligning the pellicle frame at a predetermined position; and
supplying inert gas from an inert gas supply portion into the pellicle space via the vent hole while the inert gas supply portion is in tight contact with the pellicle frame.

25. A device manufacturing method of manufacturing a device by using the device manufacturing-related apparatus defined in claim 1.

26. A device manufacturing method of manufacturing a device through a lithography process, wherein
the lithography process includes transferring a pattern onto a substrate by using the device manufacturing-related apparatus defined in claim 18.

* * * * *

UNITED STATES PATENT AND TRADEMARK OFFICE
CERTIFICATE OF CORRECTION

PATENT NO. : 6,803,996 B2  
DATED : October 12, 2004  
INVENTOR(S) : Takashi Kamono It is certified that error appears in the above-identified patent and that said Letters Patent is hereby corrected as shown below:

Title page,  
Item [56], References Cited, U.S. PATENT DOCUMENTS, "8/2002 Imamura" should read -- 8/2002 Ballard et al. --.

Column 5,  
Line 41, "aligns-the" should read -- aligns the --.

Signed and Sealed this

Nineteenth Day of July, 2005

JON W. DUDAS  
*Director of the United States Patent and Trademark Office*